(12) United States Patent
Liu

(10) Patent No.: US 7,946,737 B2
(45) Date of Patent: May 24, 2011

(54) LED ILLUMINATION DEVICE AND LIGHT ENGINE THEREOF

(75) Inventor: Tay-Jian Liu, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 171 days.

(21) Appl. No.: 12/486,719

(22) Filed: Jun. 17, 2009

(65) Prior Publication Data

US 2010/0265727 A1   Oct. 21, 2010

(30) Foreign Application Priority Data

Apr. 16, 2009 (CN) .......................... 2009 1 0301607

(51) Int. Cl.
  *B60Q 1/06* (2006.01)
(52) U.S. Cl. ..................... 362/373; 362/294; 165/104.26
(58) Field of Classification Search .................. 362/294, 362/373; 165/104.33, 104.26
  See application file for complete search history.

(56) References Cited

U.S. PATENT DOCUMENTS

| | | | | |
|---|---|---|---|---|
| 4,057,963 A | * | 11/1977 | Basiulis | 60/641.7 |
| 4,941,527 A | * | 7/1990 | Toth et al. | 165/47 |
| 6,666,261 B2 | * | 12/2003 | Yang et al. | 165/80.4 |
| 6,910,794 B2 | * | 6/2005 | Rice | 362/547 |
| 7,051,794 B2 | * | 5/2006 | Luo | 165/104.26 |
| 7,152,667 B2 | * | 12/2006 | Mochizuki et al. | 165/104.34 |
| 2009/0071637 A1 | * | 3/2009 | Liao | 165/104.33 |

* cited by examiner

*Primary Examiner* — Julie A Shallenberger
(74) *Attorney, Agent, or Firm* — Frank R. Niranjan

(57) ABSTRACT

An LED illumination device includes an optical section, an electrical section, and a heat dissipation section provided with a heat dissipation device. The heat dissipation device includes a hollow metal tube, a plurality of metal fins extending from the metal tube, a bottom cover plate and a top cover plate respectively sealing a bottom and a top of the metal tube, and a tubular member received in the metal tube and axially defining a vapor passage channel therethrough. A condensing chamber is defined between the metal tube and the tubular member. An evaporating chamber is defined between the bottom of the tubular member and the bottom cover plate. A vapor chamber is defined between the top of the tubular member and the top cover plate. A porous wick is received in the evaporating chamber and attached to the bottom cover plate. A working fluid is saturated in the porous wick.

18 Claims, 5 Drawing Sheets

LED ILLUMINATION DEVICE AND LIGHT ENGINE THEREOF

CROSS-REFERENCE TO RELATED APPLICATION

This application is related to a co-pending U.S. patent application entitled "LED ILLUMINATING DEVICE AND LIGHT ENGINE THEREOF" Ser. No. 12/486,720 and filed in the same day as the instant application. The co-pending U.S. patent application is assigned to the same assignee as the instant application. The disclosure of the above-identified application is incorporated herein by reference.

BACKGROUND

1. Technical Field

The present disclosure generally relates to light emitting diode (LED) illumination devices, and particularly to an LED illumination device with a high heat dissipating efficiency and a light engine of the LED illumination device.

2. Description of Related Art

In recent years, LEDs (light emitting diodes) are preferred for use in illumination devices rather than CCFLs (cold cathode fluorescent lamps) and other traditional lamps due to LEDs excellent properties, including high brightness, long lifespan, wide color range, and etc.

For an LED, eighty percents to ninety percents of the power consumed by the LED is converted into thermal energy, and only ten percents to twenty percents of the power consumed by the LED is converted into light. In addition, a plurality of LEDs is generally packaged in a single LED illumination device in order to obtain a desirable illumination brightness. Therefore, heat dissipation of the LED illumination device is a problem inhibiting the application of the LED illumination device, which requires to be resolved.

For a high brightness LED illumination device, a highly efficient heat dissipation device is necessary in order to timely and adequately remove the heat generated by the LED illumination device. Otherwise, the brightness, lifespan, and reliability of the LED illumination device will be seriously affected. Conventional heat dissipation devices, such as heat sinks, can no longer satisfy the heat dissipation requirement of the high brightness LED illumination device.

Therefore, it is desirable to provide an LED illumination device with a high heat dissipating efficiency.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
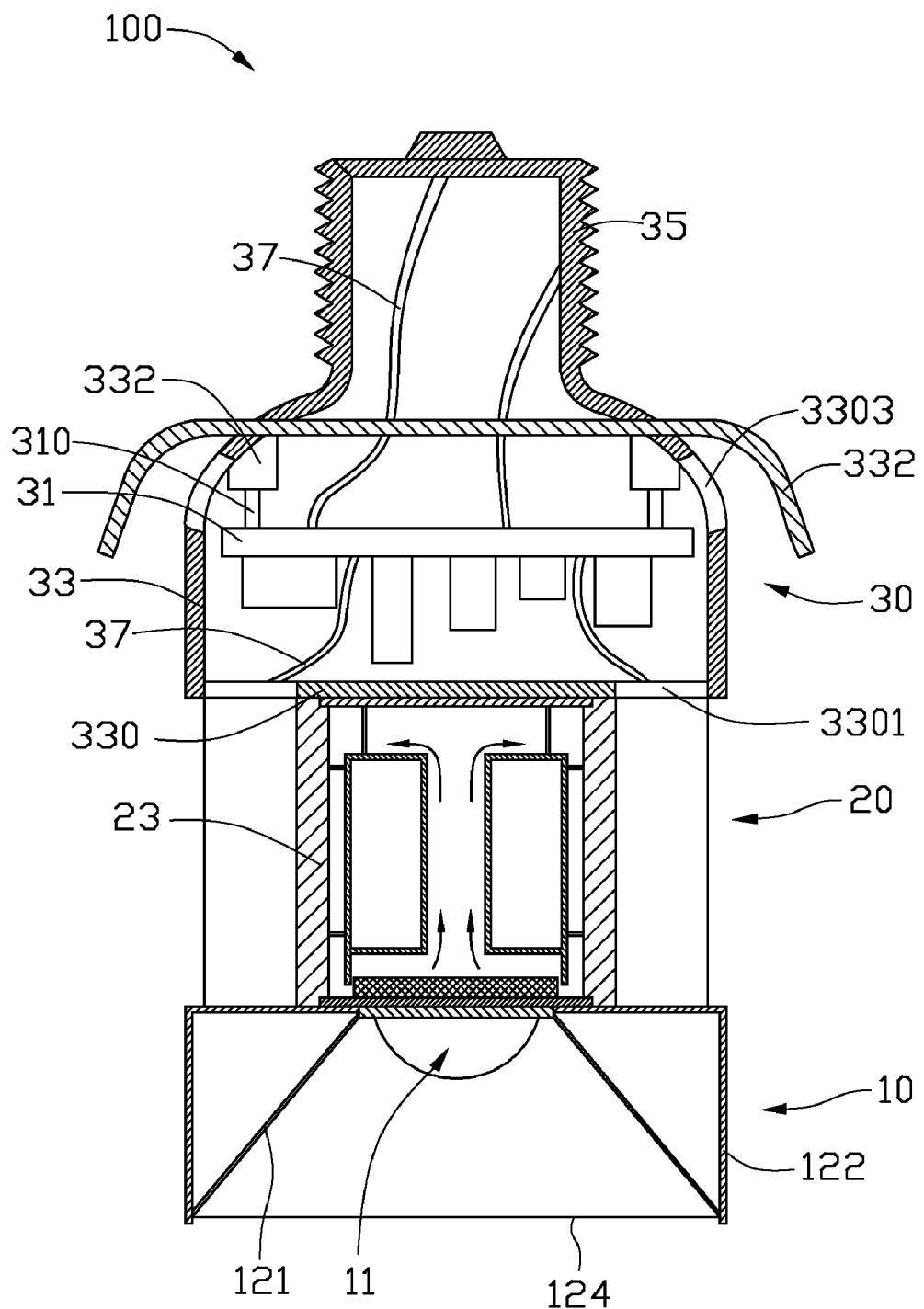
FIG. 1 is a cross-sectional view of an LED illumination device in accordance with an exemplary embodiment.

Reference will now be made to the drawing figures to describe the present disclosure in detail.

FIG. 1 is a cross-sectional view of an LED illumination device 100 in accordance with an embodiment of the present disclosure. The LED illumination device 100 includes an optical section 10, an electrical section 30, and a heat dissipation section 20 arranged between the optical section 10 and the electrical section 30. The LED illumination device 100 is substantially cylindrical. The optical section 10 is located at a front end of the LED illumination device 100, while the electrical section 30 is located at a rear end of the LED illumination device 100.

The optical section 10 includes a housing 122, a light reflector 121, a light source 11, and an optical lens 124. A rear end of the housing 122 is coupled to the heat dissipation section 20, and a front end of the housing 122 is provided with the optical lens 124. The light reflector 121 and the light source 11 are received in the housing 122. The housing 122 provides protection for the light source 11 and the light reflector 121. The light reflector 121 is cone-shaped and tapers from the front end towards the rear end of the housing 122. The light reflector 121 has a rear end located adjacent to the heat dissipation section 20, and a front end mounted to the front end of the housing 122. The light reflector 121 and the optical lens 124 provide luminescence characteristics for the light source 11. The light source 11 is mounted at the rear end of the light reflector 121 and attached to the heat dissipation section 20. Light emitted by the light source 11 is reflected and guided by the light reflector 121 to an outside of the optical section 10 through the optical lens 124.

The electrical section 30 provides drive power, control circuit and power management for the light source 11. The electrical section 30 includes a casing 33 having a front end connected with the heat dissipation section 20, a lamp head 35 connected with a rear end of the casing 33, a partition plate 330 mounted at the front end of the casing 33, and a circuit board 31 received in the casing 33. A plurality of air passage holes 3303 are radially defined through the casing 33 at a position corresponding to the circuit board 31. A dustproof cover 332 is provided over the air passage holes 3303 for preventing dust from entering into an interior of the electrical section 30. The air passage holes 3303 communicate the interior of the electrical section 30 with an outside environment and are utilized for dissipating heat of the circuit board 31. The partition plate 330 partitions the heat dissipation section 20 from the electrical section 30. The partition plate 330 is defined with a plurality of air passage openings 3301 which communicate the heat dissipation section 20 with the electrical section 30.

The circuit board 31 is mounted in the casing 33 of the electrical section 30 through a plurality of mounting seats 332 and a plurality of mounting poles 310. The mounting seats 332 are attached to an inner surface of the casing 33. The mounting poles 310 connect the circuit board 31 with the mounting seats 332. The electrical section 30 is further provided with a plurality of electrical wires 37 electrically connecting the circuit board 31 with the lamp head 35. The electrical wires 37 also extend through the partition plate 330 and electrically connect with the light source 11, whereby the light source 11 of the LED illumination device 100 can get power from an external power source via the lamp head 35.

Figure 2:
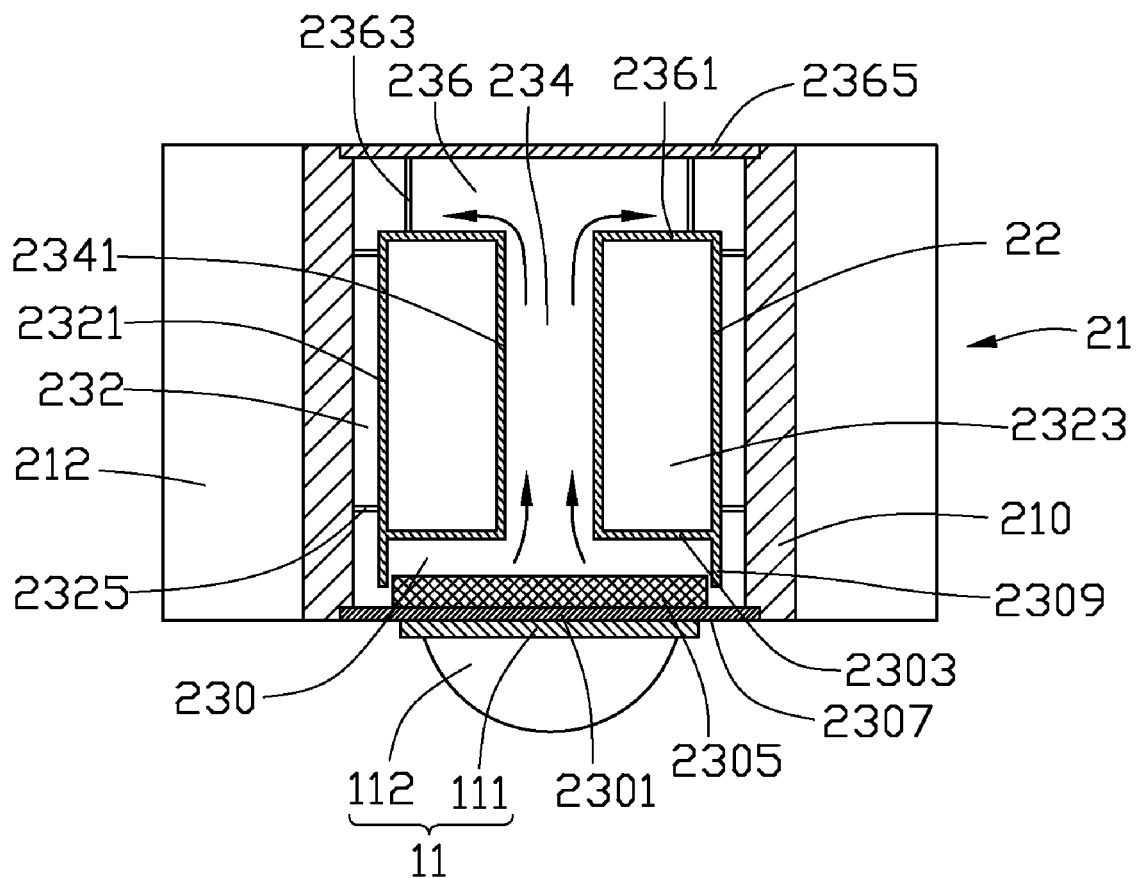
FIG. 2 shows a light engine of the LED illumination device of FIG. 1.
Figure 3:
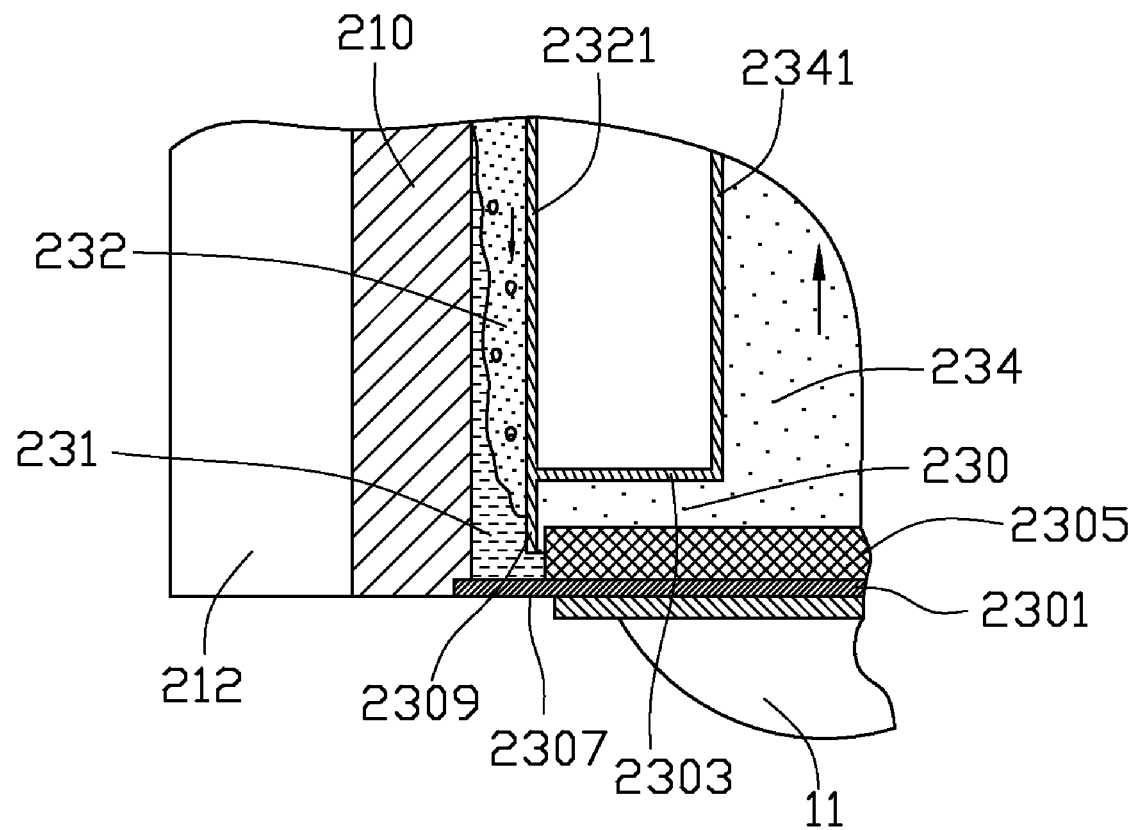
FIG. 3 shows a portion of the light engine of FIG. 2 in an enlarged scale and with working fluid therein, for illustrating a working principle of the light engine.

The heat dissipation section 20 is provided with a heat dissipation device 23. Referring also to FIGS. 2-3, the heat dissipation device 23 and the light source 11 cooperatively form a light engine 21 for the LED illumination device 100. The heat dissipation device 23 includes a cylindrical, hollow metal tube 210, a plurality of metal fins 212 extending radially outwardly from an outer circumferential surface of the metal tube 210, a bottom cover plate 2301 hermetically sealing a bottom of the metal tube 210, a top cover plate 2365 hermetically sealing a top of the metal tube 210, and a tubular member 22 received in the metal tube 210. A working fluid 231 such as water, alcohol is filled in the metal tube 210 and the heat dissipation device 23 employs a phase change of the working fluid 231 in the metal tube 210 to actively dissipate heat generated by the light source 11. More detailed description is given hereinafter.

The tubular member 22 is coaxially arranged with the metal tube 210. The tubular member 22 has a diameter smaller than the metal tube 210, with a cylindrical condensing chamber 232 defined between the metal tube 210 and the tubular member 22. A bottom of the tubular member 22 is spaced from the bottom cover plate 2301, with an evaporating chamber 230 defined between the bottom of the tubular member 22 and the bottom cover plate 2301. A vapor passage channel 234 is axially defined through a central portion of the tubular member 22 for passage of vapor. A top of the tubular member 22 is spaced from the top cover plate 2365, with a vapor chamber 236 defined between the top of the tubular member 22 and the top cover plate 2365. The vapor passage channel 234 fluidically connects a center portion of the evaporating chamber 230 with a center portion of the vapor chamber 236. The condensing chamber 232 fluidically connects a peripheral portion of the vapor chamber 236 with a peripheral portion of the evaporating chamber 230.

Particularly, the tubular member 22 includes an inner tube 2341, an outer tube 2321, a bottom plate 2303, and a top plate 2361. Each of the inner tube 2341 and the outer tube 2321 is cylindrical. The outer tube 2321 has a diameter greater than the inner tube 2341 but smaller than the metal tube 210. The inner tube 2341, the outer tube 2321 and the metal tube 210 are coaxially assembled to each other. The top cover plate 2365, the top plate 2361, the bottom plate 2303 and the bottom cover plate 2301 are parallel to each other. The vapor passage channel 234 is enclosed by the inner tube 2341. The condensing chamber 232 is defined between an inner circumferential surface of the metal tube 210 and an outer circumferential surface of the outer tube 2321 of the tubular member 22. The condensing chamber 232 is annular in profile and extends axially along an axial direction of the metal tube 210. The evaporating chamber 230 is defined between the bottom plate 2303 and the bottom cover plate 2301. The vapor chamber 236 is defined between the top plate 2361 and the top cover plate 2365.

In the present embodiment, the inner tube 2341, the outer tube 2321, the bottom plate 2303 and the top plate 2361 are assembled together to form the tubular member 22, with an annular hollow chamber 2323 defined between the inner tube 2341 and the outer tube 2321. Alternatively, the tubular member 22 can be integrally formed from a solid column. The solid column is axially defined with the vapor passage channel 234 through a central portion thereof, without the hollow chamber 2323 therein, whereby an assembly process for the tubular member 22 can be eliminated; however, in this embodiment, the LED illumination device is heavier.

The tubular member 22 is fixedly mounted in the metal tube 210 via a plurality of mounting poles 2363, 2325, wherein the mounting poles 2363 are disposed in the vapor chamber 236 and connect the top plate 2361 with the top cover plate 2365, and the mounting poles 2325 are disposed in the condensing chamber 232 and connect the outer tube 2321 with the metal tube 210. A porous wick 2305 is received in the evaporating chamber 230 and attached to an inner surface of the bottom cover plate 2301. The wick 2305 is selected from one of screen mesh, sintered powder, fiber, and metal foam. The working fluid 231 is filled in the evaporating chamber 230 and saturated in the wick 2305.

The light source 11 is attached to an outer surface 2307 of the bottom cover plate 2301, whereby heat generated by the light source 11 is transferred to and effectively dissipated by the heat dissipation device 23. The light source 11 includes a substrate 111 forming electrical circuits thereon, and at least one LED 112 (light emitting diode) arranged on the substrate 111 and electrically connected to the electrical circuits. The substrate 111 is attached to the outer surface 2307 of the bottom cover plate 2301. The LED 112 is electrically connected with the electrical wires 37 of the electrical section 30. Alternatively, the electrical circuits formed on the substrate 111 may be directly formed on the outer surface 2307 of the bottom cover plate 2301, and the LED 112 is directly attached to the outer surface 2307 of the bottom cover plate 2301, whereby the substrate 111 can be omitted and a heat resistance between the LED 112 and the bottom cover plate 2301 is reduced. A layer of thermal interface material (TIM) may be applied between the substrate 111 and the outer surface 2307 of the bottom cover plate 2301 to eliminate an air interstice therebetween, to thereby enhance a heat conduction efficiency between the light source 11 and the bottom cover plate 2301. Alternatively, the substrate 111 can be attached to the bottom cover plate 2301 fixedly and intimately through surface mount technology (SMT).

The bottom cover plate 2301 is made of a metal having a high thermal conductivity, such as copper or aluminum. The tubular member 22 can be made of a metal or a non-metal material. When the tubular member 22 is made of a non-metal material, a total weight of the heat dissipation device 23 can be greatly reduced.

In operation, heat generated by the LED 112 is absorbed by the bottom cover plate 2301. The heat of the LED 112 is rapidly transferred from the bottom cover plate 2301 to the working fluid 231 in the evaporating chamber 230. The working fluid 231 absorbs latent heat and vaporizes into vapor in the evaporating chamber 230. The vapor floats upwardly from the evaporating chamber 230 and enters into the vapor passage channel 234. Then, the vapor flows upwardly along the vapor passage channel 234 towards the vapor chamber 236 and moves from the vapor chamber 236 into the condensing chamber 232. The vapor in the condensing chamber 232 releases the latent heat carried thereby to the metal tube 210, and the latent heat is finally dissipated to ambient atmosphere by the metal fins 212. After the vapor releases the latent heat, the vapor is condensed into condensate. The condensate falls from the condensing chamber 232 into the evaporating chamber 230, where the condensate is available again for a next phase change cycle, whereby the heat generated by the LED 112 is continuously and effectively removed by the heat dissipation device 23.

In order to maintain a unidirectional movement of the working fluid 231 in the metal tube 210, an annular flange 2309 extends downwardly from a bottom of the outer tube 2321 into the evaporating chamber 230. The flange 2309 blocks the vapor in the evaporating chamber 230 from flowing radially outwardly to enter directly into the condensing chamber 232.

Figure 4:
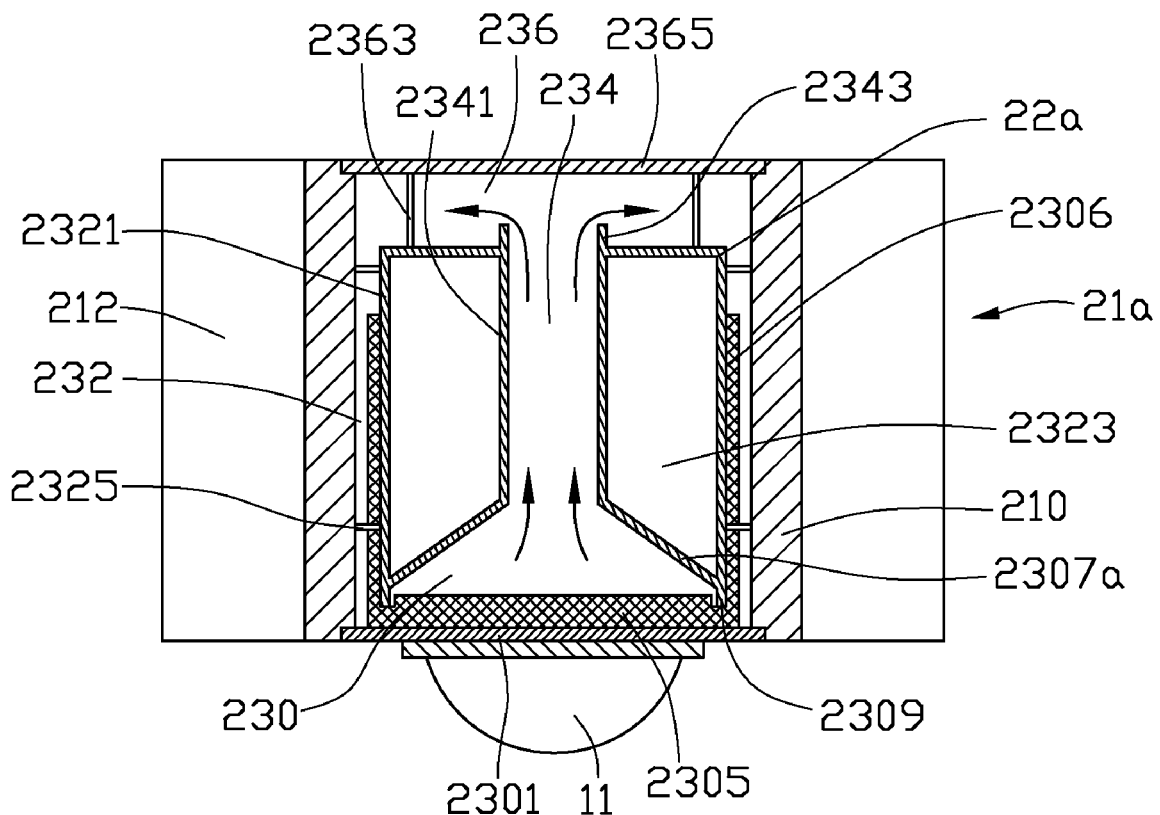
FIG. 4 shows an alternative light engine for the LED illumination device.

Referring to FIG. 4, an alternative light engine 21a for the LED illumination device 100 is illustrated. Except the following differences, the light engine 21a of the alternative embodiment is essentially the same as the light engine 21 shown in FIGS. 2-3. In the alternative embodiment, the bottom plate 2307a of the tubular member 22a is cone-shaped and tapered from the evaporating chamber 230 towards the vapor passage channel 234, so that the vapor in the evaporating chamber 230 can move into the vapor passage channel 234 more smoothly. Another porous wick 2306 is provided in the condensing chamber 232 and attached to the outer tube 2321. Alternatively, the another porous wick 2306 can be attached to the metal tube 210. The another porous wick 2306 is connected with the porous wick 2305 in the evaporating chamber 230, whereby the condensate in the condensing chamber 232 can be absorbed by the another wick 2306 and then drawn back to the evaporating chamber 230 via a capillary force provided by the another wick 2306. A top end 2343 of the inner tube 2341 extends upwardly into the vapor chamber 236. The top end 2343 of the inner tube 2341 blocks the condensate at an upper section of the condensing chamber 232 from returning back to the vapor passage channel 234, to further maintain the unidirectional movement of the working fluid 231 in the metal tube 210.

Figure 5:
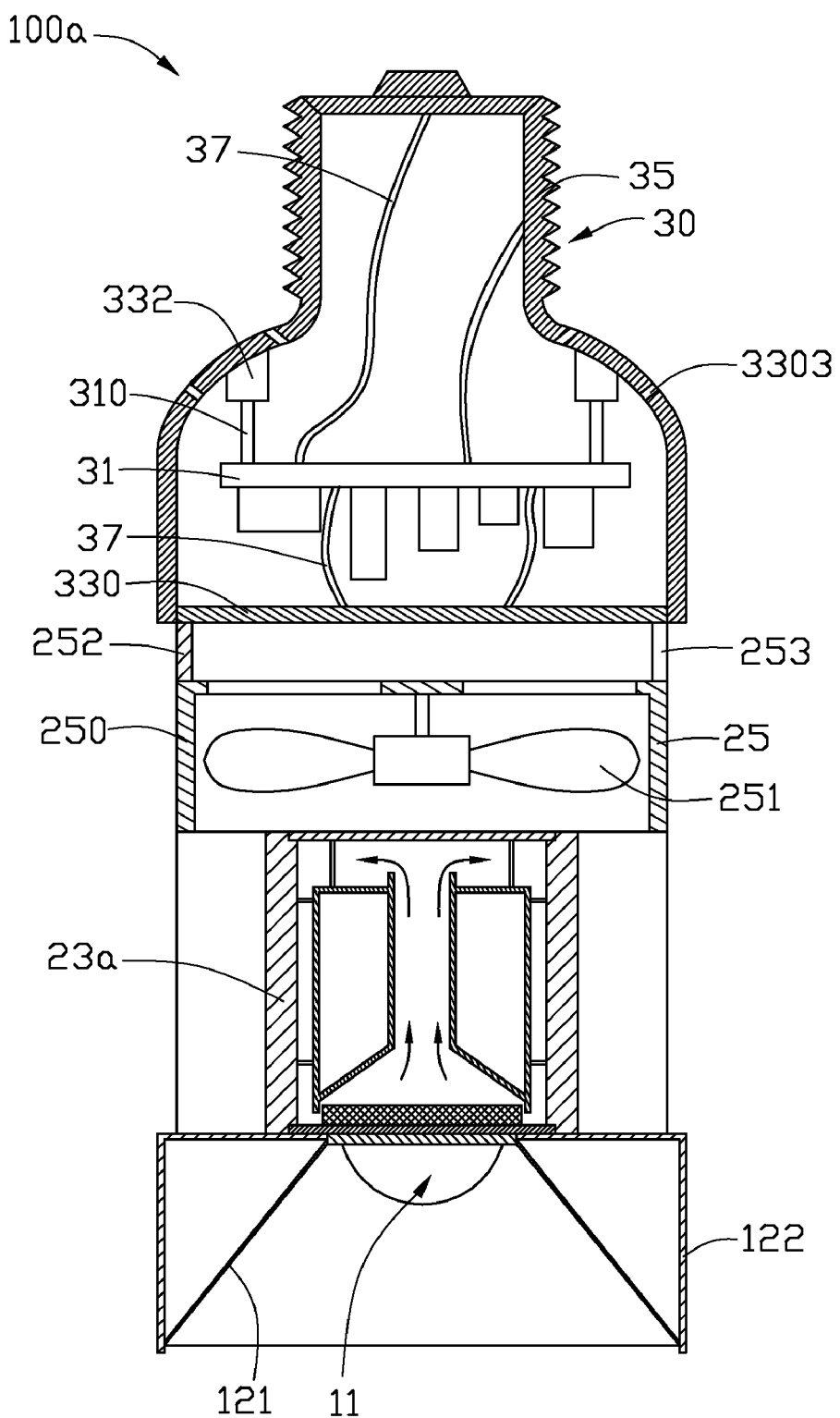
FIG. 5 is a cross-sectional view of an LED illumination device in accordance with an alternative embodiment.

Referring to FIG. 5, an LED illumination device 100a according to an alternative embodiment of the present disclosure is illustrated. Except the following differences, the LED illumination device 100a of the alternative embodiment is essentially the same as the LED illumination device 100 shown in FIG. 1. In the alternative embodiment, a cooling fan 25 is provided over the heat dissipation device 23a. The cooling fan 25 is located between the heat dissipation device 23a and the electrical section 30. The cooling fan 25 includes a fan housing 250 and a fan impeller 251 rotatably received in the fan housing 250. An annular spacer 252 is interposed between the cooling fan 25 and the partition plate 330 of the electrical section 30. A plurality of air passage openings 253 are defined through a circumferential periphery of the spacer 252.

The cooling fan 25 can be configured to begin operation as soon as the LED 112 starts emitting light. Alternatively, the cooling fan 25 can be automatically activated to rotate when a junction temperature of the LED 112 reaches a specified temperature value after the LED 112 has worked for a particular time period, and the cooling fan 25 does not operate when the junction temperature of the LED 112 is below the specified temperature value. When the cooling fan 25 does not operate, the heat of the LED 112 is mainly dissipated by the heat dissipation device 23a.

When the cooling fan 25 operates, the cooling fan 25 inhales air from the ambient atmosphere via the air passage openings 253 of the spacer 252. An airflow is then generated by the cooling fan 25 and flows towards the heat dissipation device 23a, whereby a forced air convection is circulated in the LED illumination device 100a.

It is to be understood, however, that even though numerous characteristics and advantages of the present disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. An LED illumination device, comprising:
an optical section being provided with a light source therein;
an electrical section being electrically connected with the light source; and
a heat dissipation section located between the optical section and the electrical section, the heat dissipation section being provided with a heat dissipation device, the heat dissipation device comprising a hollow metal tube, a plurality of metal fins extending radially outwardly from the metal tube, a bottom cover plate hermetically sealing a bottom of the metal tube, a top cover plate hermetically sealing a top of the metal tube, and a tubular member received in the metal tube, the tubular member having a diameter smaller than the metal tube with a condensing chamber defined between the metal tube and the tubular member, a bottom of the tubular member being spaced from the bottom cover plate with an evaporating chamber defined between the bottom of the tubular member and the bottom cover plate, a vapor passage channel being axially defined through a central portion of the tubular member, a top of the tubular member being spaced from the top cover plate with a vapor chamber defined between the top of the tubular member and the top cover plate, the vapor passage channel connecting the evaporating chamber with the vapor chamber, the condensing chamber connecting the vapor chamber with the evaporating chamber, a working fluid being filled in the evaporating chamber, the light source being thermally attached to an outer surface of the bottom cover plate;
wherein a porous wick is received in the evaporating chamber and attached to the bottom cover plate, and the working fluid is saturated in the porous wick.
2. The LED illumination device of claim 1, wherein the tubular member comprises an inner tube, an outer tube, a bottom plate and a top plate, the outer tube has a diameter greater than the inner tube but smaller than the metal tube, the inner tube, the outer tube and the metal tube are coaxially assembled to each other, the vapor passage channel is enclosed by the inner tube, the condensing chamber is defined between the metal tube and the outer tube, the evaporating chamber is defined between the bottom plate and the bottom cover plate, the vapor chamber is defined between the top plate and the top cover plate.
3. The LED illumination device of claim 2, wherein another porous wick is provided in the condensing chamber and attached to one of the outer tube and the metal tube, and the another wick is connected with the porous wick of the evaporating chamber.
4. The LED illumination device of claim 2, wherein the bottom plate of the tubular member is cone-shaped and tapered from the evaporating chamber towards the vapor passage channel.
5. The LED illumination device of claim 2, wherein an annular flange extends downwardly from a bottom of the outer tube into the evaporating chamber.
6. The LED illumination device of claim 2, wherein a top end of the inner tube extends upwardly into the vapor chamber.
7. The LED illumination device of claim 2, wherein the tubular member is fixedly mounted in the metal tube via a plurality of mounting poles, wherein some of the mounting poles are disposed in the vapor chamber and connect the top plate with the top cover plate, and the other mounting poles are disposed in the condensing chamber and connect the outer tube with the metal tube.

8. The LED illumination device of claim 1, wherein the condensing chamber is annular and extends axially along an axial direction of the metal tube.

9. The LED illumination device of claim 1, wherein the electrical section comprises a casing and a circuit board received in the casing, a plurality of air passage holes is provided through a circumferential periphery of the casing, and the light source is electrically connected with the circuit board.

10. The LED illumination device of claim 1, wherein a cooling fan is provided over the heat dissipation device and configured to generate an airflow through the heat dissipation device, and the cooling fan is located between the heat dissipation device and the electrical section.

11. The LED illumination device of claim 10, wherein a spacer is provided between the cooling fan and the electrical section, a plurality of air passage openings are defined radially through a circumferential periphery of the spacer, and the airflow flows through the air passage openings of the spacer.

12. A light engine of an LED illumination device, comprising:
a light source; and
a heat dissipation device comprising a hollow metal tube, a plurality of metal fins extending radially outwardly from the metal tube, a bottom cover plate hermetically sealing a bottom of the metal tube, a top cover plate hermetically sealing a top of the metal tube, and a tubular member received in the metal tube, the tubular member having a diameter smaller than the metal tube with a condensing chamber defined between the metal tube and the tubular member, a bottom of the tubular member being spaced from the bottom cover plate with an evaporating chamber defined between the bottom of the tubular member and the bottom cover plate, a vapor passage channel being axially defined through a central portion of the tubular member, a top of the tubular member being spaced from the top cover plate with a vapor chamber defined between the top of the tubular member and the top cover plate, the vapor passage channel connecting the evaporating chamber with the vapor chamber, the condensing chamber connecting the vapor chamber with the evaporating chamber, a working fluid being filled in the evaporating chamber, the light source being thermally attached to an outer surface of the bottom cover plate;
wherein a porous wick is received in the evaporating chamber and attached to the bottom cover plate, and the working fluid is saturated in the porous wick.

13. The light engine of the LED illumination device of claim 12, wherein the tubular member comprises an inner tube, an outer tube, a bottom plate and a top plate, the outer tube has a diameter greater than the inner tube but smaller than the metal tube, the inner tube, the outer tube and the metal tube are coaxially assembled to each other, the vapor passage channel is enclosed by the inner tube, the condensing chamber is defined between the metal tube and the outer tube, the evaporating chamber is defined between the bottom plate and the bottom cover plate, the vapor chamber is defined between the top plate and the top cover plate.

14. The light engine of the LED illumination device of claim 12, wherein another porous wick is provided in the condensing chamber and attached to one of the outer tube and the metal tube, and the another wick is connected with the porous wick of the evaporating chamber.

15. The light engine of the LED illumination device of claim 12, wherein the bottom plate of the tubular member is cone-shaped and tapered from the evaporating chamber towards the vapor passage channel.

16. The light engine of the LED illumination device of claim 12, wherein an annular flange extends downwardly from a bottom of the outer tube into the evaporating chamber.

17. The light engine of the LED illumination device of claim 12, wherein the tubular member is fixedly mounted in the metal tube via a plurality of mounting poles, wherein some of the mounting poles are disposed in the vapor chamber and connect the top plate with the top cover plate, and the other mounting poles are disposed in the condensing chamber and connect the outer tube with the metal tube.

18. The light engine of the LED illumination device of claim 12, wherein the condensing chamber is annular and extends axially along an axial direction of the metal tube.

* * * * *